(12) United States Patent
Smith et al.

(10) Patent No.: US 7,084,795 B2
(45) Date of Patent: Aug. 1, 2006

(54) VIDEO SIGNAL PROCESSING SYSTEM WITH A DYNAMIC ADC CALIBRATION LOOP AND RELATED METHODS

(75) Inventors: Sterling Smith, Hsin-Chu Hsien (TW); Chia-Ming Yang, Hsin-Chu (TW)

(73) Assignee: MStar Semiconductor, Inc., Hsin-Chu Hsien (TW)

(*) Notice: Subject to any disclaimer, the term of this patent is extended or adjusted under 35 U.S.C. 154(b) by 0 days.

(21) Appl. No.: 10/908,741

(22) Filed: May 24, 2005

(65) Prior Publication Data
US 2005/0270197 A1 Dec. 8, 2005

Related U.S. Application Data

(60) Provisional application No. 60/576,022, filed on Jun. 2, 2004.

(51) Int. Cl.
*H03M 1/10* (2006.01)
(52) U.S. Cl. ...................... 341/120; 341/155
(58) Field of Classification Search ............. 341/118, 341/119, 120, 121, 131, 156, 155; 327/307, 327/64
See application file for complete search history.

(56) References Cited

U.S. PATENT DOCUMENTS

| 4,410,876 A | * | 10/1983 | Sawagata ............ 348/572 |
| 4,947,168 A | * | 8/1990 | Myers ............ 341/120 |
| 5,442,465 A | * | 8/1995 | Compton ............ 358/482 |
| 6,603,416 B1 | | 8/2003 | Masenas et al. |

* cited by examiner

*Primary Examiner*—Brian Young
(74) *Attorney, Agent, or Firm*—Winston Hsu

(57) ABSTRACT

A video signal processing system with a dynamic calibration loop of an ADC comprises a calibration switch for transmitting signals according to a control signal; a reference switch module for transmitting reference voltages according to a plurality of control signals; a reference voltage generator coupled to the reference switch module for providing the reference voltages; a coarse tuner coupled to the calibration switch and the reference switch module for coarse-tuning received signals; an ADC coupled to the coarse tuner for converting analog signals to digital signals; a fine-tuner coupled to the ADC for fine-tuning received signals; and a calibration logic module for controlling the calibration switch, the reference switch module, the coarse tuner, the ADC, and the fine tuner according to signals outputted from the fine tuner, so as to compensate errors of the ADC.

19 Claims, 7 Drawing Sheets

VIDEO SIGNAL PROCESSING SYSTEM WITH A DYNAMIC ADC CALIBRATION LOOP AND RELATED METHODS

CROSS REFERENCE TO RELATED APPLICATIONS

The application claims the benefit of U.S. Provisional Application No. 60/576,022, filed Jun. 2, 2004, and included herein by reference.

BACKGROUND OF INVENTION

1. Field of the Invention

The present invention provides a video signal processing system with a dynamic calibration loop of an analog to digital converter and related methods, and more particularly, a video signal processing system compensating gain and offset errors of the analog to digital converter with a coarse tuner before the analog to digital converter and a fine tuner after the analog to digital converter.

2. Description of the Prior Art

Analog to digital converters (ADC) are utilized broadly in signal processing systems for converting analog signals into digital signals. Calibrations of ADCs are usually accomplished before hardwares of the ADCs leave the factory. However, the performance of ADC is distorted as long as the ADC is used.

Please refer to FIG. 1. FIG. 1 is a diagram of response of a prior art ADC. In FIG. 1, the transverse axis represents voltage level of input analog signals, and the vertical axis represents magnitude of output digits. Curve S1 is the ideal response of the prior art ADC, and curve S2 is the real response of the prior art ADC after being used for a period of time. First of all, the slopes of curve S1 and curve S2 are different. Second, the offset of the response of the prior art ADC drifts an amount of D1. These distortions decrease the accuracy of ADCs seriously. Besides, the shifts of dc-level of input signals can also ruin out the performance of the ADC.

In video signal processing systems, such as TVs, digital TVs, and etc., performance and accuracy of ADCs are very important for the quality of displaying images. Due to the lack of ability to calibrate the ADCs dynamically after the ADCs leave the factory, video signal processing systems can do nothing about the degradation of performance of ADCs.

SUMMARY OF INVENTION

It is therefore a primary objective of the claimed invention to provide a video signal processing system with a calibration loop and related methods.

According to the claimed invention, the present invention discloses a video signal processing system with a dynamic calibration loop of an analog to digital converter. The video signal processing system comprises a calibration switch for transmitting signals according to a control signal; a reference switch module for transmitting reference voltages according to a plurality of control signals; a reference voltage generator coupled to the reference switch module for providing the reference voltages; a coarse tuner coupled to the calibration switch and the reference switch module for coarse-tuning received signals; an analog to digital converter coupled to the coarse tuner for converting analog signals to digital signals; a fine-tuner coupled to the analog to digital converter for fine-tuning received signals; and a calibration logic module for controlling the calibration switch, the reference switch module, the coarse tuner, the analog to digital converter, and the fine tuner according to signals outputted from the fine tuner, so as to compensate errors of the analog to digital converter.

According to the claimed invention, the present invention further discloses a method for dynamically calibrating an analog to digital converter. The method comprises accumulating an offset error and a gain error over a plurality of samples for a digit output signal during a calibration interval; generating a plurality of control signals according to said accumulated errors; and dynamically calibrating said analog to digital converter in response to said control signals.

These and other objectives of the present invention will no doubt become obvious to those of ordinary skill in the art after reading the following detailed description of the preferred embodiment that is illustrated in the various figures and drawings.

DETAILED DESCRIPTION

In most video signal processing systems, especially like TVs, digital TVs and HDTVs, there are periodic breaks for horizontal/vertical synchronizations in video signals. For example, the periodic breaks which include a frontporch period, a horizontal/vertical sync pulse and a backporch period are called horizontal blanking periods here. During horizontal blanking periods, video signals should contain no active display content, so preferably the video signal processing system displays the lowest gray level accordingly.

Figure 1:
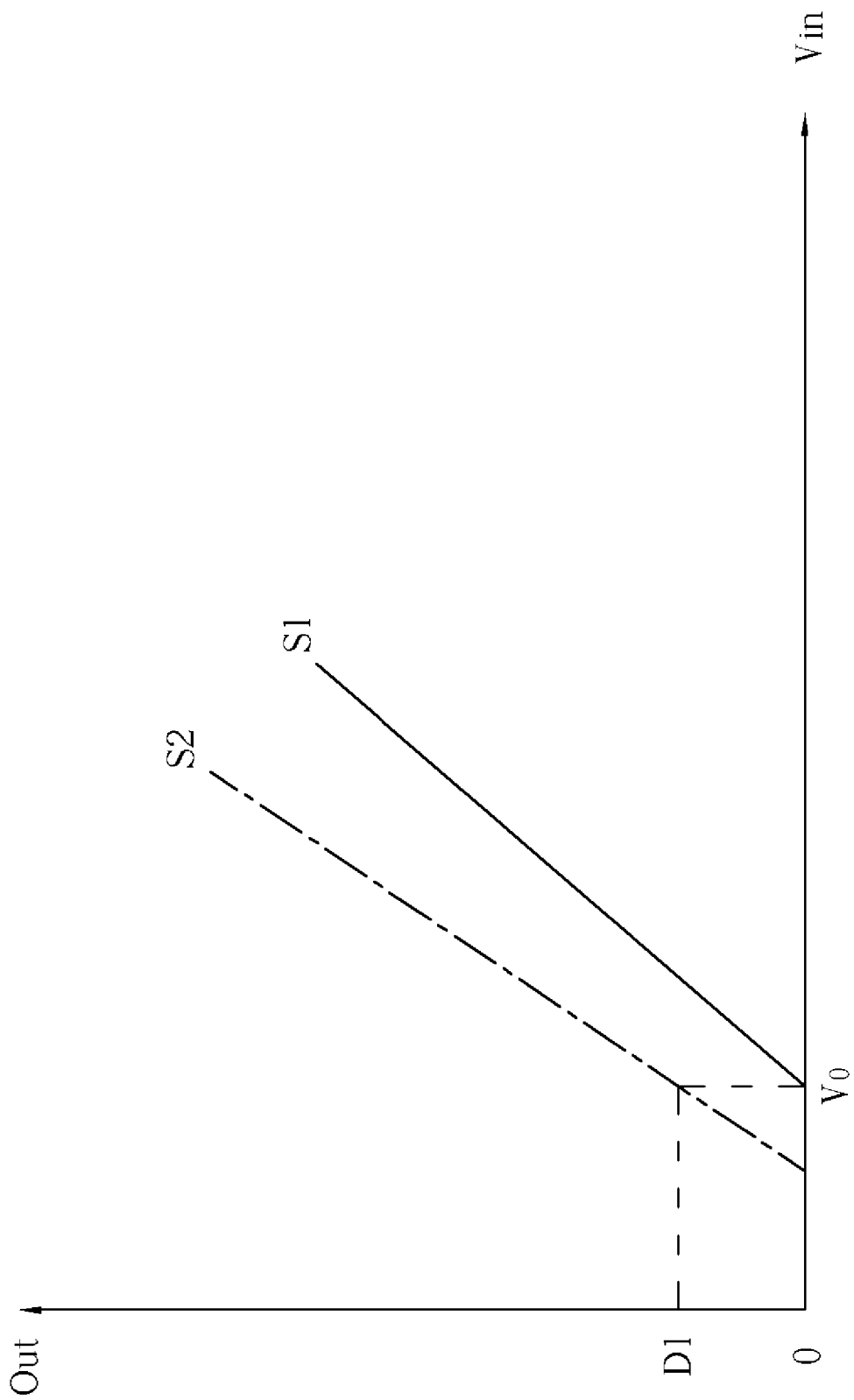
FIG. 1 illustrates a diagram of response of a prior art ADC.
Figure 2:
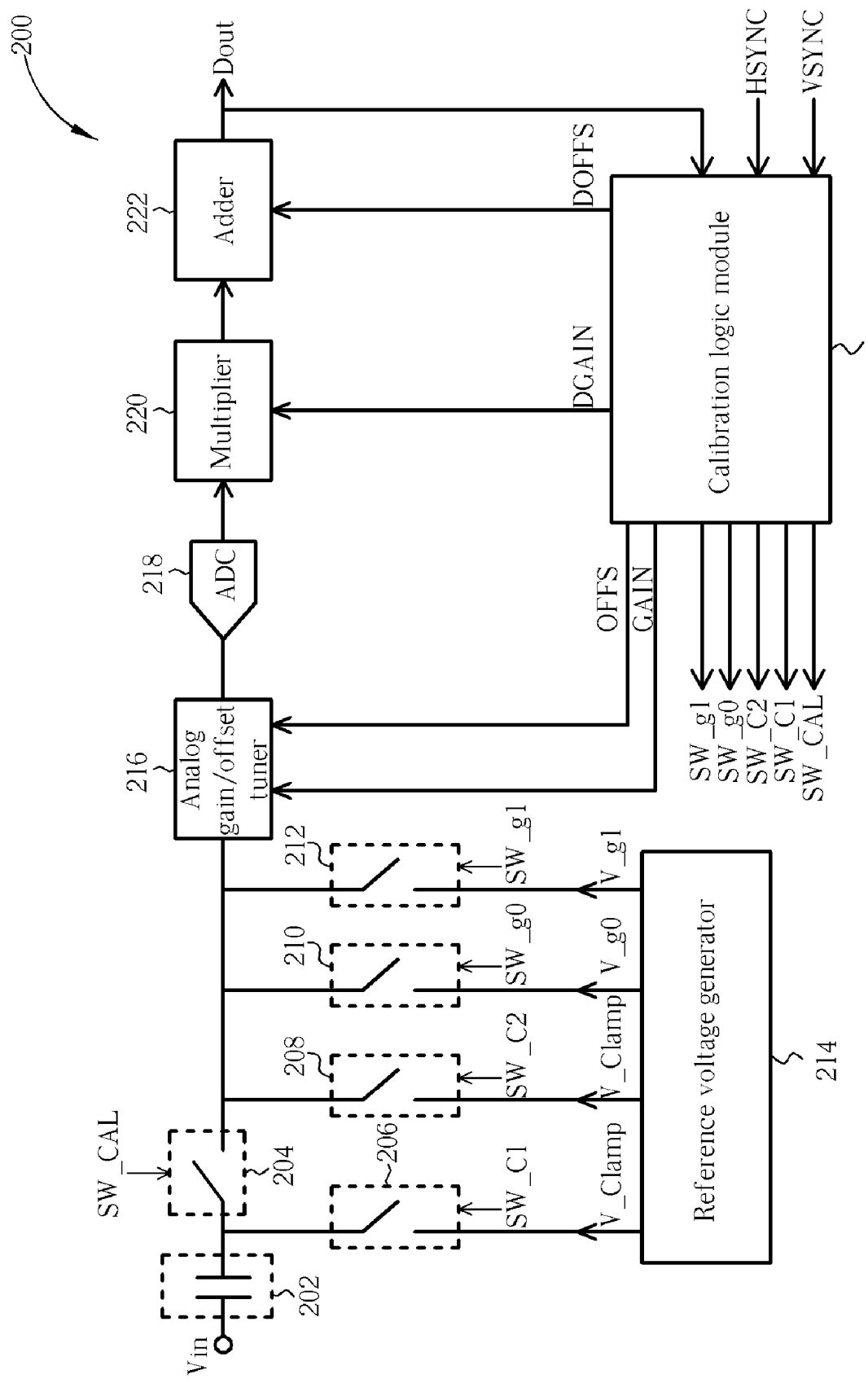
FIG. 2 illustrates a block diagram of a video signal processing system in accordance with the present invention.

Please refer to FIG. 2, which illustrates a block diagram of a video signal processing system 200 in accordance with the present invention. The video signal processing system 200 includes a capacitor 202, switches 204, 206, 208, 210, 212, a reference voltage generator 214, an analog gain and offset tuner 216, an ADC 218, a digital multiplier 220, a digital adder 222, and a calibration logic module 224. The present invention can do calibrations during the horizontal blanking periods and the backporch periods, which are calibration intervals. The capacitor 202 acts as a DC level storage to shift DC level of input signal Vin to an internal voltage V_clamp through switch SW_C1. The calibration logic module 224 controls the switches 204, 206, 208, 210, and 212 with signals SW_CAL, SW_C1, SW_C2, SW_g0, and SW_g1. For example, signals SW_CAL, SW_C1, SW_C2, SW_g0, and SW_g1 provide different voltage level. The switch 204 is turned off during the calibration intervals, so as to disconnect the ADC 218 from the input signals Vin. The switches 206 and 208 are clamp switches, serving dc-level voltages V_clamp provided by the reference voltage generator 214 for the analog gain and offset tuner 216, while the switches 210 and 212 serve voltages V_g0 and V_g1 for the analog gain and offset tuner 216. The analog gain and offset tuner 216 coarse-tunes the gain and offset levels of received signals roughly according to control signals GAIN and OFFS provided by the calibration logic module 224. The ADC 218 transforms signals outputted from the analog gain and offset tuner 216 into digital signals. Then, the digital multiplier 220, controlled by the calibration logic module 224 with a control signal DGAIN, fine-tunes gain levels of digital signals outputted from the ADC 218. Also, the digital adder 222, controlled by the calibration logic module 224 with a control signal DOFFS, fine-tunes offset levels of output signals of the digital multiplier 220. Output signals DOUT of the digital adder 222 are also bypassed into the calibration logic module 224, so the calibration logic module 224 can determine gain and offset errors of the output signals DOUT and generate the control signals GAIN, OFFS, DGAIN, and DOFFS accordingly. In a preferred embodiment, the ADC 218 is 10-bit-resolution, the analog gain and offset tuner 216 is 8-bit-resolution and the digital multiplier 220 and the digital adder 222 are 12-bit-resolution.

Figure 3:
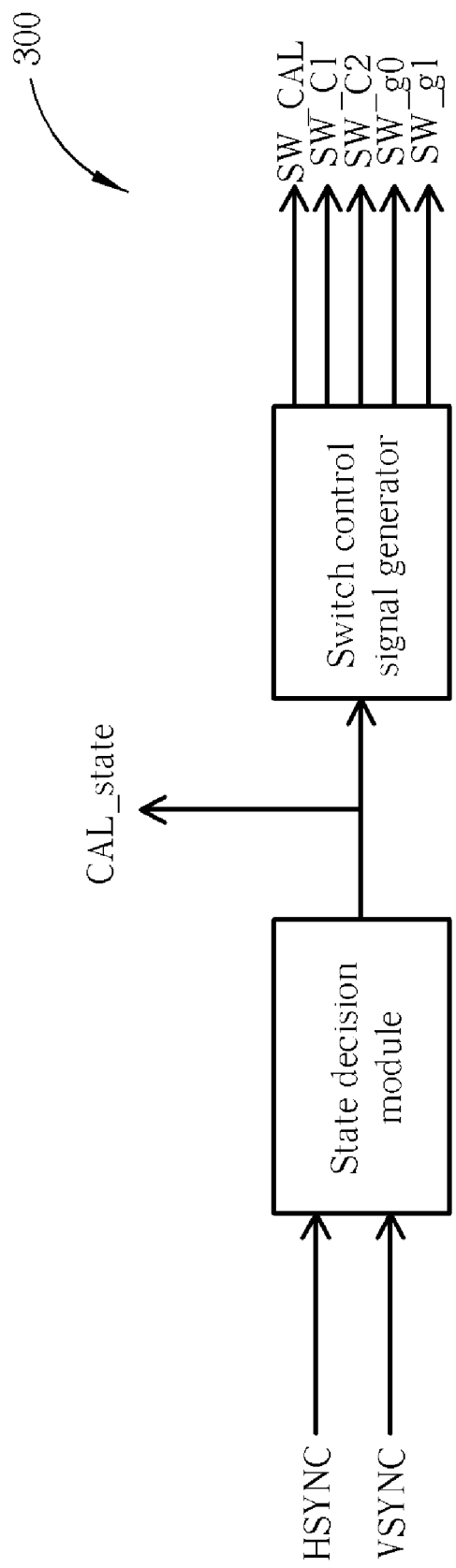
FIG. 3 illustrates a block diagram of a calibration state decision unit of a calibration logic module.
Figure 4:
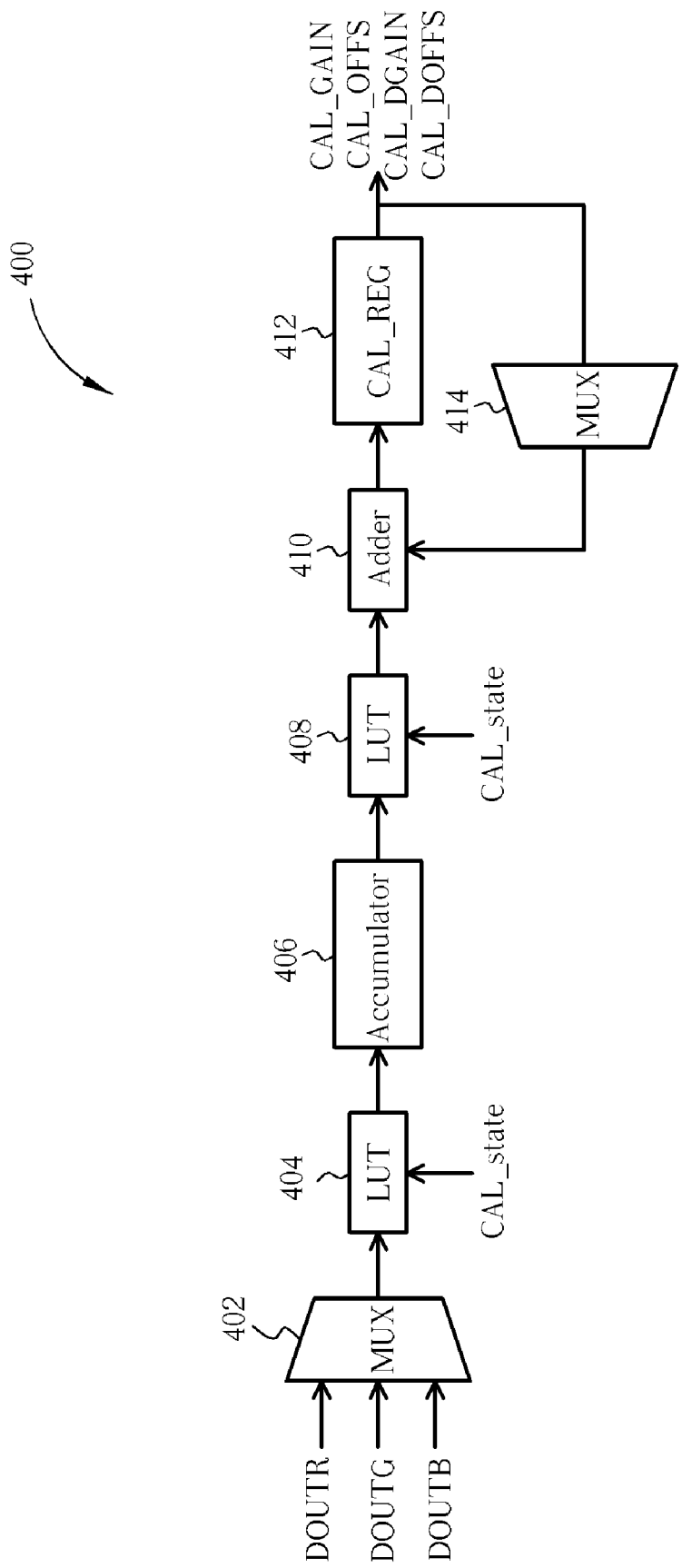
FIG. 4 illustrates a block diagram of an error decision unit of a calibration logic module.
Figure 5:
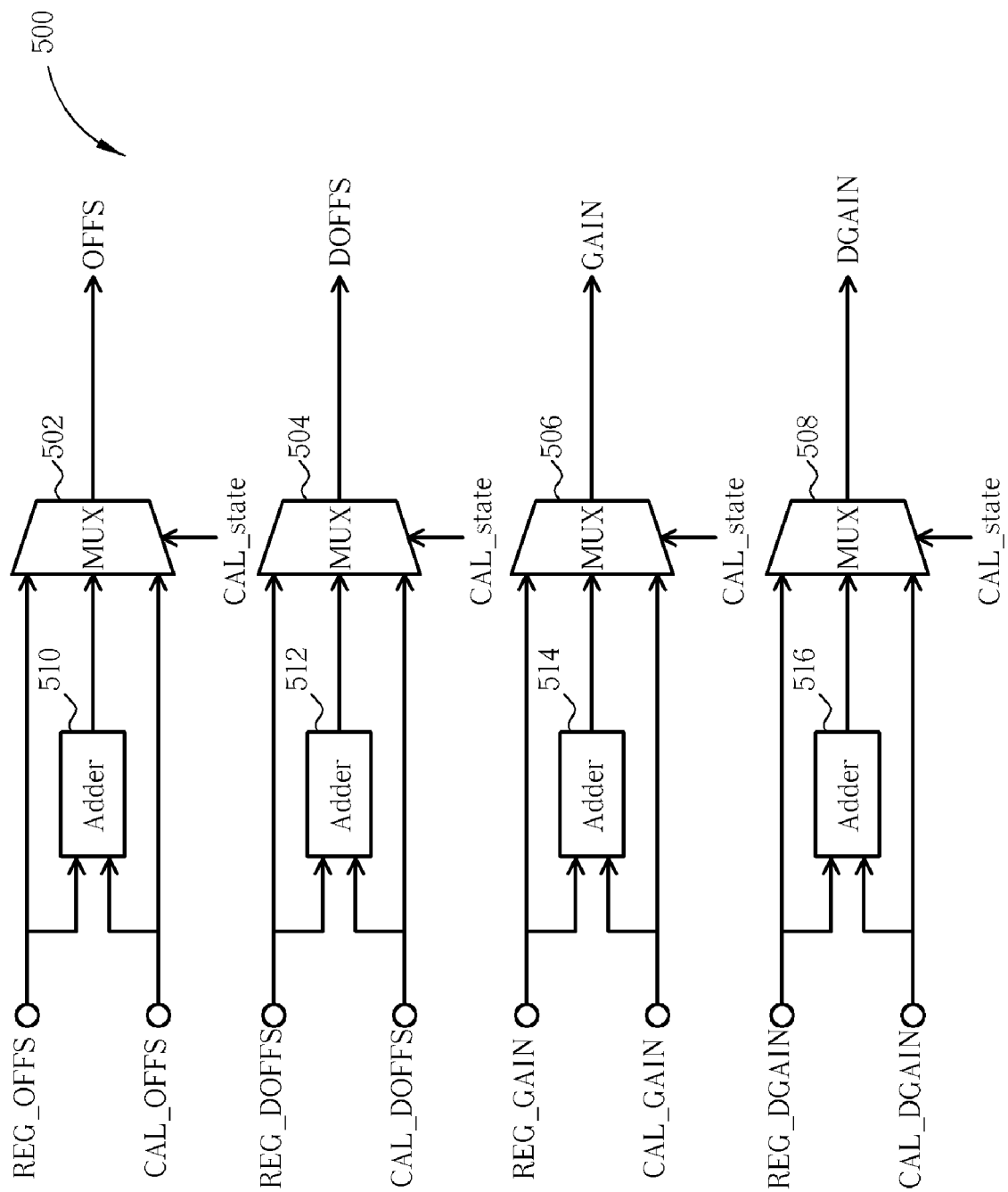
FIG. 5 illustrates a schematic diagram of a adjustment signal output unit of a calibration logic module.

The calibration logic module 224 can be illustrated in three parts as shown in FIG. 3, FIG. 4, and FIG. 5. First, please refer to FIG. 3, which illustrates a block diagram of a calibration state decision unit 300 of the calibration logic module 224. The calibration state decision unit 300 includes a state decision module 302 and a control signal generator 304. The state decision module 302 determines calibration state signals CAL-state according to horizontal blanking periods or vertical blanking periods, while the control signal generator 304 generates the control signals SW_CAL, SW_C1, SW_C2, SW_g0, and SW_g1 according to the calibration state signals CAL_state. Then, please refer to FIG. 4, which illustrates a block diagram of an error decision unit 400 of the calibration logic module 224. The error decision unit 400 includes multiplexer 402 and 414, look-up tables 404 and 408, an accumulator 406, an adder 410, and a calibration register 412. To reduce area, each calibration is preferably performed on one channel at a time in rotating fashion. The multiplexer 402 is to select output data of a channel from signals DOUTR, DOUTG, and DOUTB, which are R, G, and B components of the output signals DOUT. With the accumulator 406 and the adder 410, gain or offset errors are accumulated over multiple samples. For example, the look-up table 404 transforms the error of each pixel sample for the accumulator 406 for accumulating the error. The look-up table 408 transforms the accumulated error so as to calibrate the control register CAL_REG 412, preferably including CAL_GAIN, CAL_OFFS, CAL_DGAIN, and CAL_DOFFS registers. Persons skilled in the art should note that the look-up tables 404 and 408 herein are exemplified for mapping the errors in this embodiment. Various modifications could be made without departing from the spirit of the present invention.

Furthermore, please refer to FIG. 5, which illustrates a schematic diagram of an adjustment signal output unit 500, preferably in the calibration logic module 224. The adjustment signal output unit 500 includes multiplexers 502, 504, 506, and 508, and adders 510, 512, 514, and 516. The adders 510 adds a user-programmed register REG_OFFS and the calibration control register CAL_OFFS together, and the multiplexer 502 selects a register from the user-programmed register REG_OFFS, the calibration control register CAL_OFFS, and their combination according to the signal CAL_state, so as to output the control signal OFFS to the analog gain and offset tuner 216. Similarly, according to the signal CAL_state, the multiplexer 504 selects a register from a user-programmed register REG_DOFFS, the calibration control register CAL_DOFFS, and their combination provided by the adder 512, so as to output the control signal DOFFS to the digital adder 222; the multiplexer 506 selects a register from a user-programmed register REG_GAIN, the calibration control register CAL_GAIN, and their combination provided by the adder 514, so as to output the control signal GAIN to the analog gain and offset tuner 216; the multiplexer 506 selects a register from a user-programmed register REG_DGAIN, the calibration control register CAL_DGAIN, and their combination provided by the adder 516, so as to output the control signal DGAIN to the digital multiplier 220.

With the calibration state decision unit 300, the error decision unit 400, and the adjustment signal output unit 500, the calibration logic module 224 can generate control signals SW_CAL, SW_C1, SW_C2, SW_g0, and SW_g1, and accumulate gain and offset errors of the output signals DOUT, then feedback the offset and gain control signals OFFS, DOFFS, GAIN, and DGAIN to the analog gain and offset tuner 216, the digital multiplier 220, and the digital adder 222, so as to compensate the ADC gain and offset errors.

Figure 6:
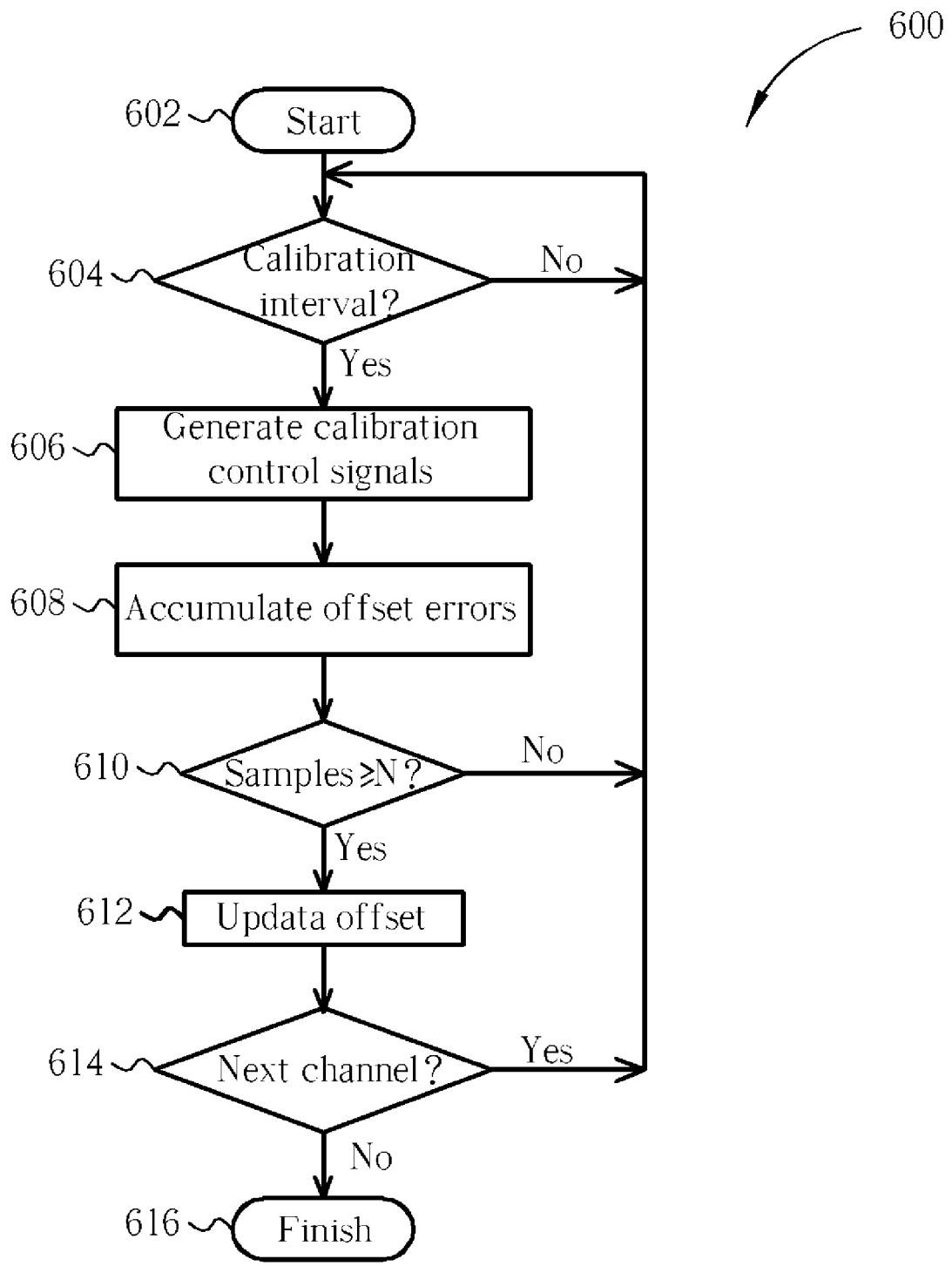
FIG. 6 illustrates a flowchart of a process for calibrating an offset of a video signal processing system in accordance with the present invention.

The present invention can perform a gain calibration or an offset calibration respectively. Please refer to FIG. 6, which illustrates a flowchart of a process 600 for calibrating an offset of the video signal processing system 200 in accordance with the present invention. The process 600 includes following steps:

Step 602: start.

Step 604: determine whether a calibration interval reaches or not. If the calibration interval reaches, go to step 606, or else, wait for the calibration interval.

Step 606: generate control signals for calibrating the offset, so as to switch the ADC 218 to the reference voltage V_clamp and switch the analog gain and offset tuner 216 to previous calibrated values.

Step 608: accumulate offset errors of ADC output signals.

Step 610: determine whether the quantity of the samples is larger than a default number N or not. If the quantity is larger than the default number N, go to step 612, or else, go to step 604.

Step 612: calculate offset errors to update new offset value by adjusting the analog gain and offset tuner 216 for coarse-tuning, and adjusting the digital adder 222 for fine-tuning.

Step 614: determine whether there is another channel to be calibrated or not. If yes, go to step 604, or else, go to step 616.

Step 616: finish.

Therefore, during offset calibration, the switch 204 is turned off and the switch 208 is turned on, so the input of the analog gain and offset tuner 216 is disconnected from the input signal Vin but coupled to the clamp voltage V_clamp. At the same time, the user-programmed offset registers REG_OFFS and REG_DOFFS are disabled and the calibration offset registers CAL_OFFS and CAL_DOFFS are applied to the analog gain and offset tuner 216 and the digital adder 222. Then, the calibration logic module 224 averages a plurality of samples of output signals of the ADC 218 and estimates offset errors of the ADC 218. According to the estimated offset errors, the calibration logic module 224 adjusts the calibration offset registers CAL_OFFS and CAL_DOFFS to compensate the offset error of the ADC 218.

Figure 7:
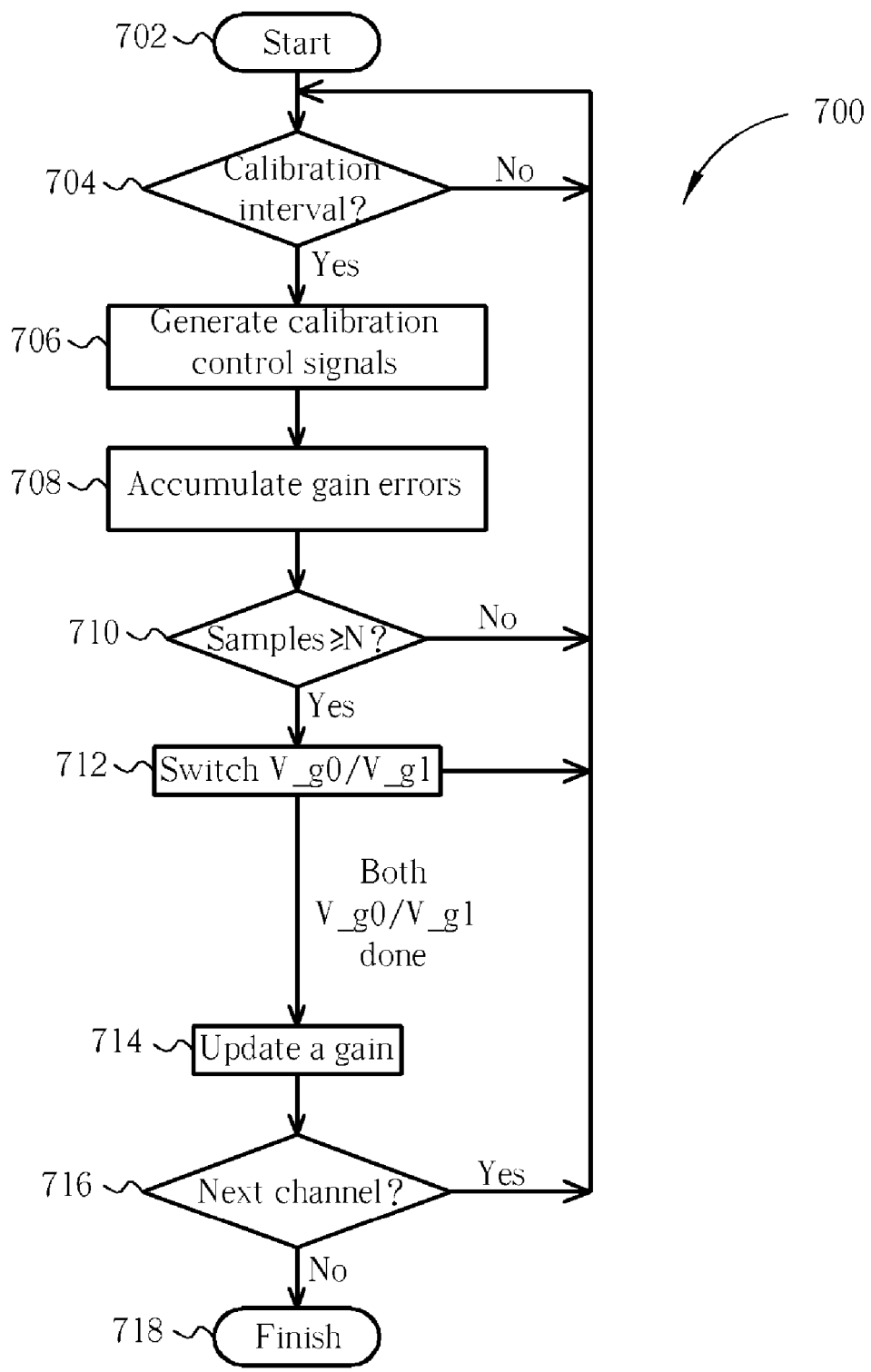
FIG. 7 illustrates a flowchart of a process for calibrating a gain of a video signal processing system in accordance with the present invention.

Similarly, please refer to FIG. 7, which illustrates a flowchart of a process 700 for calibrating a gain of the video signal processing system 200 in accordance with the present invention. The process 700 includes following steps:

Step 702: start.

Step 704: determine whether a calibration interval reaches or not. If the calibration interval reaches, go to step 706, or else, wait for the calibration interval.

Step 706: generate control signals for calibrating the gain, so as to switch the ADC 218 to the reference voltages V_g0 and V_g1 by turns, and switch the analog gain and offset tuner 216 to previous calibrated value.

Step 708: accumulate gain errors of ADC output signals.

Step 710: determine whether calibrated samples are larger than a default number N or not. If the calibrated samples are larger than the default number N, go to step 712, or else, go to step 704.

Step 712: change the calibration to another reference voltage. If both of the reference voltages V_g0 and V_g1 are done, go to step 714, or else, go to step 704.

Step 714: calculate gain errors according to a difference between accumulated results corresponding to the reference voltages V_g0 and V_g1, and update new gain levels by adjusting the analog gain and offset tuner 216 for coarse-tuning, and adjusting the digital adder 222 for fine-tuning.

Step 716: determine whether there is another channel to be calibrated or not. If yes, go to step 704, or else, go to step 718.

Step 718: finish.

Therefore, during gain calibration, the switch 204 is turned off and the switches 210 and 212 are turned on sequentially, so the input of the analog gain and offset tuner 216 is disconnected from the input signal Vin but coupled to the voltage V_g0 and V_g1 by turns. The user-programmed gain registers REG_GAIN and REG_DGAIN are disabled and the calibration gain registers CAL_GAIN and CAL_DGAIN are applied to the analog gain and offset tuner 216 and the digital multiplier 220. Then, the calibration logic module 224 calculates two averages of a plurality of samples corresponding to the voltages V_g0 and V_g1. The averages corresponding to the voltages V_g0 and V_g1 are subtracted, so as to cancel out offsets and perform gain calibration independent from ADC offset. The difference of the two averages is compared to an ideal value to adjust the calibration gain registers CAL_GAIN and CAL_DGAIN, so as to compensate the gain error of the ADC 218.

Therefore, the present invention can compensate gain and offset errors of the analog to digital converter with the calibration loop, which is accomplished by a coarse tuner (the analog gain and offset tuner 216) and fine tuners (the digital multiplier 220 and the digital adder 222) for 10-bit or higher resolution ADC. The coarse tuner provide only near LSB (least significant bit) precision relative to ADC for area and technology saving. According to the fine tuner of the present invention, more accuracy ADC gain and offset error correction can be achieved without accuracy deterioration issue of analog circuit. The digital gain value is controlled in the range of slightly larger than 1 to equal to 1. By keeping digital gain in this range, it can prevent from ADC output code saturate and clamp to minimum and maximum and preserve full dynamic range input.

The present invention further discloses a method for dynamically calibrating an ADC (analog to digital converter). The offset error and the gain error are accumulated over a plurality of samples for the digit video output signal during a calibration interval. Preferably, the calibration interval is a horizontal blanking period or a vertical blanking period. The digit video output signal can be a red component signal, a green component signal, or a blue component signal, so the hardware can be shared and reduced. The offset error is averaged over N samples for estimating an offset drift during the calibration interval. The gain errors corresponding to a first reference voltage and a second reference voltage during the calibration interval are accumulated and substracted. A plurality of control signals are generated according to the accumulated errors. Then, the ADC is dynamically calibrated in response to the control signals every N pixel samples. For example, the ADC is coarse-tuned in response to an analog gain control signal, and an analog offset control signal; and the ADC is fine-tuned in response to a digital gain control signal, and a digital offset control signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A video signal processing system with a dynamic calibration loop of an analog to digital converter comprising:
   a calibration switch for transmitting signals according to a control signal;
   a reference switch module for transmitting reference voltages according to a plurality of control signals;
   a reference voltage generator coupled to the reference switch module for providing the reference voltages;
   a coarse tuner coupled to the calibration switch and the reference switch module for coarse-tuning received signals;
   an analog to digital converter coupled to the coarse tuner for converting analog signals to digital signals;
   a fine-tuner coupled to the analog to digital converter for fine-tuning received signals; and
   a calibration logic module for controlling the calibration switch, the reference switch module, the coarse tuner, the analog to digital converter, and the fine tuner according to signals outputted from the fine tuner, so as to compensate errors of the analog to digital converter.

2. The video signal processing system of claim 1, wherein the calibration switch is switched off according to the control signal provided by the calibration logic module during a calibration interval.

3. The video signal processing system of claim 1, wherein the reference switch module comprises:
   a first switch for transmitting a first reference voltage provided by the reference voltage generator;
   a second switch for transmitting a second reference voltage provided by the reference voltage generator; and
   a third switch for transmitting a third reference voltage provided by the reference voltage generator.

4. The video signal processing system of claim 3, wherein the first switch is switched on when the calibration logic module performs an offset calibration.

5. The video signal processing system of claim 3, wherein the second switch and the third are switched on by turns when the calibration logic module performs a gain calibration.

6. The video signal processing system of claim 1, wherein the coarse tuner comprises:

an analog gain tuner for coarse-tuning gain levels of received signals according to a control signal provided by the calibration logic module; and an analog offset tuner for coarse-tuning direct-current levels of received signals according to a control signal provided by the calibration logic module.

7. The video signal processing system of claim 1, wherein the fine-tuner comprises:

a digital multiplier for multiplying received digital signals by a value provided by the calibration logic module, so as to compensate gain errors of the analog to digital converter; and a digital adder for adding received digital signals with a value provided by the calibration logic module, so as to compensate offset errors of the analog to digital converter.

8. The video signal processing system of claim 1, wherein the calibration logic module comprises:

a calibration state decision unit for determining calibration intervals according to video synchronization pulses, and controlling the calibration switch and the reference switch module;

an error decision unit for determining errors of signals outputted from the fine tuner; and a adjustment signal output unit for controlling the coarse tuner and the fine tuner according to the errors determined by the error decision unit.

9. The video signal processing system of claim 7, wherein the calibration state decision unit comprises:

a stale decision module for determining calibration intervals according to video synchronization pulses; and a control signal generator for outputting control signals to the calibration switch and the reference switch module according to the calibration intervals.

10. The video signal processing system of claim 7, wherein the error decision unit averages a plurality of samples of the analog to digital converter, so as to determine the errors of the analog to digital converter according to the average.

11. The video signal processing system of claim 7, wherein the adjustment signal output unit comprises a plurality of register modules each for selecting a register from a user-programmed register, a calibration register, and a combination of the user-programmed register and the calibration register.

12. The video signal processing system of claim 1, further comprising a capacitor between the calibration switch and input signals for shifting the DC level of input signals.

13. The video signal processing system of claim 1, further comprising a clamp switch between the calibration switch and input signals for serving a clamp voltage provided by the reference voltage generator.

14. A method for dynamically calibrating an analog to digital converter, comprising following steps:

accumulating an offset error and a gain error over a plurality of samples for a digit output signal during a calibration interval;

generating a plurality of control signals according to said accumulated errors; and dynamically calibrating said analog to digital converter in response to said control signals, wherein said control signals comprise an analog gain control signal, an analog offset control signal, a digital gain control signal, and a digital offset control signal; and wherein said dynamically calibrating step coarse-tunes said analog to digital converter in response to said analog gain control signal and said analog offset control signal, and fine-tunes said analog to digital converter in response to said digital gain control signal, and said digital offset control signal.

15. The method of claim 14, wherein the calibration interval is a horizontal blanking period.

16. The method of claim 14, wherein the calibration interval is a vertical blanking period.

17. The method of claim 14, further comprising a step of averaging said offset error over said samples for estimating an offset drift during said calibration interval.

18. The method of claim 14, wherein said accumulating step accumulates said gain error corresponding to a first reference voltage and a second reference voltage during said calibration interval.

19. The method of claim 14, wherein said digit output signal is a digital video output signal selected from a group of a red component signal, a green component signal, and a blue component signal.

* * * * *